United States Patent
Lee et al.

(10) Patent No.: US 7,612,450 B2
(45) Date of Patent: Nov. 3, 2009

(54) SEMICONDUCTOR PACKAGE INCLUDING DUMMY BOARD AND METHOD OF FABRICATING THE SAME

(75) Inventors: Jong-Gi Lee, Chungcheongnam-do (KR); Tae-Joo Hwang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/765,367

(22) Filed: Jun. 19, 2007

(65) Prior Publication Data
US 2008/0006949 A1    Jan. 10, 2008

(30) Foreign Application Priority Data
Jun. 19, 2006    (KR) .................. 10-2006-0055060

(51) Int. Cl.
H01L 23/48    (2006.01)
H01L 23/52    (2006.01)
H01L 29/40    (2006.01)
H01L 21/44    (2006.01)

(52) U.S. Cl. .............................. 257/738; 257/E21.508; 257/E23.021; 257/E23.069; 438/613

(58) Field of Classification Search .................. 257/738, 257/E21.508, E23.021, E23.069; 438/613
See application file for complete search history.

(56) References Cited

U.S. PATENT DOCUMENTS

| | | | |
|---|---|---|---|
| 5,982,033 A * | 11/1999 | Ohsawa et al. | 257/737 |
| 6,093,971 A | 7/2000 | Oppermann et al. | 257/783 |
| 6,380,492 B1 * | 4/2002 | Yoshioka | 174/256 |
| 6,437,451 B2 * | 8/2002 | Farnworth et al. | 257/780 |
| 6,501,176 B2 * | 12/2002 | Jackson | 257/738 |
| 6,515,324 B2 * | 2/2003 | Shibuya et al. | 257/296 |
| 6,736,306 B2 * | 5/2004 | Byun et al. | 228/180.22 |

(Continued)

FOREIGN PATENT DOCUMENTS

JP    2001-35882    2/2001

(Continued)

OTHER PUBLICATIONS

English language abstract of Japanese Publication No. 2001-35882.

(Continued)

*Primary Examiner*—Ida M Soward
(74) *Attorney, Agent, or Firm*—Marger Johnson & McCollom, P.C.

(57) ABSTRACT

Provided are a semiconductor package and a method of fabricating the same. The semiconductor package includes a semiconductor chip, and a plurality of conductive balls, e.g., solder balls formed on a joint surface of the semiconductor chip. A dummy board includes openings aligned with the solder balls and is bonded to the joint surface of the semiconductor chip. An adhesive material is interposed between the semiconductor chip and the dummy board to adhere the dummy board to the semiconductor chip. The adhesive material is applied on an adhesion surface of the dummy board adhered to a joint surface of the semiconductor chip. The dummy board is adhered to the joint surface of the semiconductor chip such that the solder balls are aligned with the openings. Cheap underfill materials can be selectively used, and a process time for reflow and curing of the adhesive material can be greatly reduced.

21 Claims, 7 Drawing Sheets

U.S. PATENT DOCUMENTS

| | | | |
|---|---|---|---|
| 6,864,587 B2 * | 3/2005 | Shibata | 257/784 |
| 7,098,526 B2 * | 8/2006 | Kobayashi et al. | 257/660 |
| 7,215,026 B2 * | 5/2007 | Park et al. | 257/737 |
| 7,215,031 B2 * | 5/2007 | Egawa | 257/773 |
| 7,368,821 B2 * | 5/2008 | Kim et al. | 257/738 |
| 2001/0013647 A1 * | 8/2001 | Hsu et al. | 257/697 |
| 2004/0113260 A1 * | 6/2004 | Sunohara et al. | 257/698 |
| 2005/0253275 A1 * | 11/2005 | Hsu | 257/778 |
| 2006/0049501 A1 * | 3/2006 | Lee et al. | 257/686 |
| 2007/0069378 A1 * | 3/2007 | Park et al. | 257/737 |

FOREIGN PATENT DOCUMENTS

| | | |
|---|---|---|
| JP | 2001-308140 | 11/2001 |
| KR | 1999-0059039 | 7/1999 |
| KR | 2000-0010497 | 2/2000 |
| KR | 2001-0001774 | 1/2001 |
| KR | 2001-0056778 | 7/2001 |

OTHER PUBLICATIONS

English language abstract of Korean Publication No. 2001-0056778.

* cited by examiner

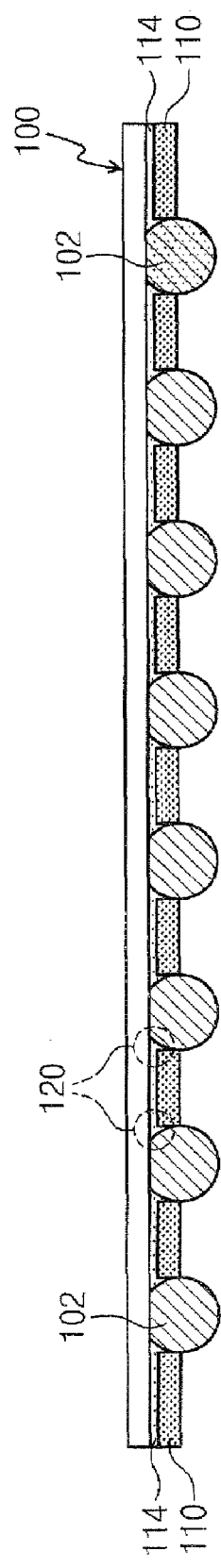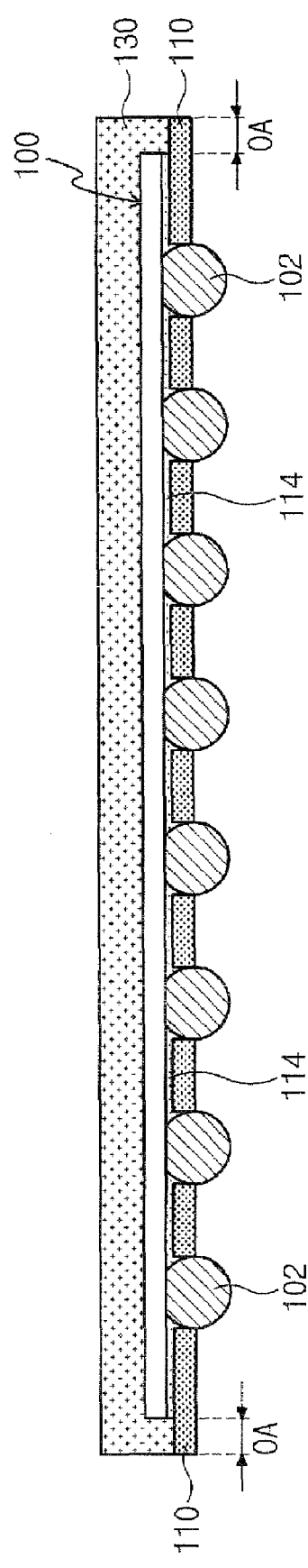

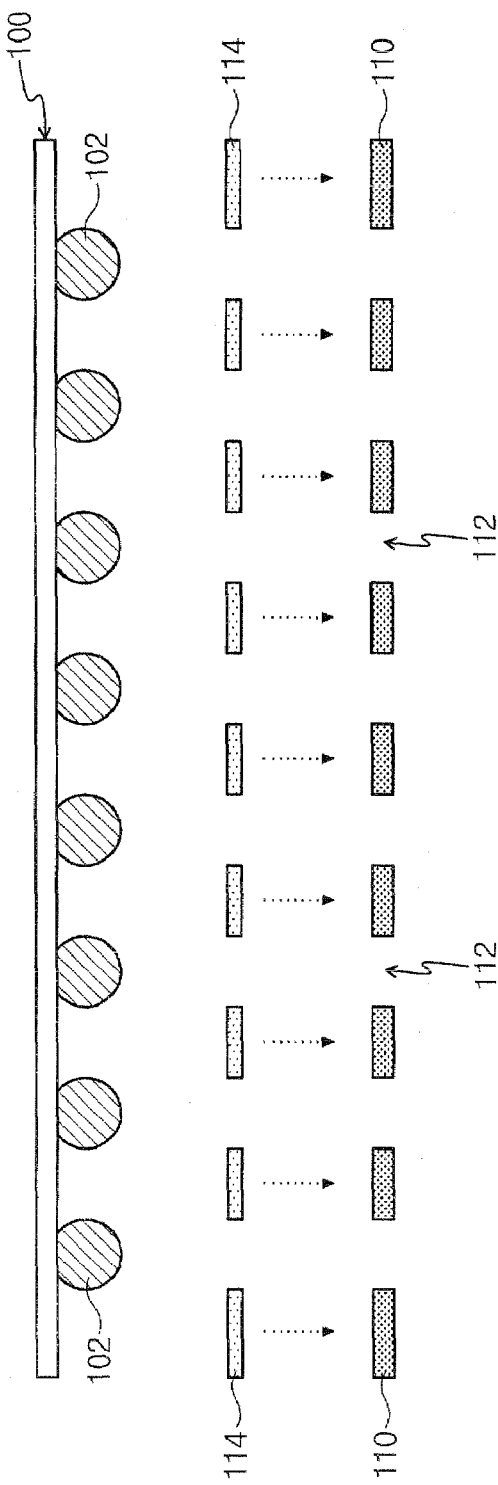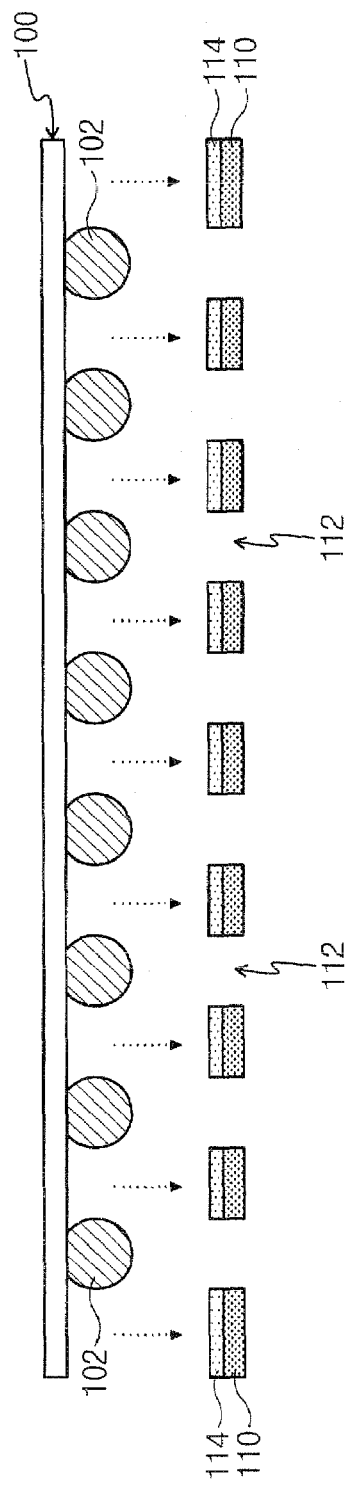

SEMICONDUCTOR PACKAGE INCLUDING DUMMY BOARD AND METHOD OF FABRICATING THE SAME

CROSS-REFERENCE TO RELATED APPLICATIONS

This U.S. non-provisional patent application claims priority under 35 U.S.C. § 119 to Korean Patent Application No. 2006-55060, filed on Jun. 19, 2006, the entire contents of which are herein incorporated by reference.

BACKGROUND

1. Technical Field

The present invention relates to a package of a semiconductor device and a method of fabricating the same, and more particularly, to a semiconductor package and a method of fabricating the same.

2. Background of the Related Art

As semiconductor devices have been miniaturized, packages with a size close to a chip size have been developed, such as a flip chip package and a chip size package. The chip size package generally has a lower reliability when compared with a conventional leadframe style package. In particular, since a stress is applied to a coupling section of the chip size package due to the thermal expansion coefficient difference between the package and a circuit board, the chip size package may be separated from the circuit board during manufacturing, testing, or operation.

Recently, a technique for applying an underfill material on a joint surface of a semiconductor chip including solder balls has been introduced in order to improve the reliability of the chip size package. The underfill material relieves a stress applied to the solder balls to prevent the solder balls from coming off the semiconductor chip when the chip size package is coupled to the circuit board or during a thermal cycling test.

FIG. 1 is a cross-sectional view illustrating a conventional chip size package and a method of coupling the chip size package to a circuit board.

Referring to FIG. 1, a chip size package 10 includes a plurality of solder balls 14 formed on a joint surface of a semiconductor chip 12. The solder balls 14 are used as I/O terminals of the semiconductor chip 12, and the solder balls 14 can be formed by various methods as is known in the art.

A part of the solder ball 14 is bonded to the semiconductor chip 12, and a curved portion adjacent to the bonding portion has a weak resistance to stress. In order to relieve stress applied to the solder balls 14 and fix the solder balls 14 to the semiconductor chip 12, an underfill material 16 is applied on the bonding surface of the semiconductor chip 12. The underfill material 16 is applied between the solder balls 14, and then contacts curved surfaces of the solder balls 14 by curing and reflow processes.

Generally, the chip size package 10 is directly coupled to a circuit board 50 such as a printed circuit board (PCB). As illustrated, a solder mask 54 is formed on a coupling surface of the circuit board 50 to provide a region for coupling of the solder balls 14. The solder mask 54 includes a plurality of openings 58 corresponding to the solder balls 14 to prevent the solder balls 14 from melting and contacting other portions of the circuit board 50 in addition to the pads 56. The solder balls 14 are coupled to the pads 56 formed inside the openings in the circuit board 50.

FIG. 2 is a cross-sectional view illustrating a conventional chip size package coupled to a circuit board.

Referring to FIG. 2, as the soldering process is performed at a predetermined temperature, the solder balls 14 are coupled to the corresponding pads 56, respectively. When the chip size package 10 is heated to a reflow temperature of the solder balls 14 or higher, it is electrically and mechanically coupled to the circuit board 50. Here, the underfill material 16 is reflowed and pushed into the openings 58.

As illustrated in FIG. 2, in the conventional chip size package, the underfill material 16 is coupled to the solder mask 54 to form a stress relief layer, and is cured through an additional heating cycle to improve bonding strength. The underfill material 16 relieves stress applied to the solder balls 14 to prevent the solder balls 14 from coming off the circuit board 50 due to the thermal expansion coefficient difference during the heating cycle.

However, the underfill material of the conventional chip size package has fluidity, and may be reflowed or deformed during the repeated heating cycles. Therefore, the thermal expansion coefficient difference may lead to decreases in the stress relieving effect on the solder balls.

Also, since the semiconductor chip is small and thin, stress and cracks due to an external impact are quickly transmitted. Therefore, the chip size package may be separated from the circuit board in an edge portion that is the weakest portion of the semiconductor chip.

The present invention addresses these and other disadvantages of the conventional art.

SUMMARY

The present invention provides a semiconductor package such as a chip size package in which a stress applied to solder balls can be greatly relieved and a method of fabricating the chip size package. The present invention also provides a semiconductor package where damage of a semiconductor chip can be reduced during a treatment for the chip size package and a method of fabricating the same.

Embodiments of the present invention provide semiconductor packages such as chip size packages including a dummy board for relieving a stress. The chip size package includes a semiconductor chip, and a plurality of solder balls formed on a joint surface of the semiconductor chip. A dummy board includes openings aligned with the solder balls and is bonded to the joint surface of the semiconductor chip. An adhesive material is interposed between the semiconductor chip and the dummy board to adhere the dummy board to the semiconductor chip.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 3A is a cross-sectional view illustrating a semiconductor package according to a first embodiment of the present invention;

FIG. 3B is a cross-sectional view illustrating a semiconductor package according to a second embodiment of the present invention;

FIGS. 6 and 7 are cross-sectional views illustrating a method of fabricating a semiconductor package according to an embodiment of the present invention;

DETAILED DESCRIPTION

Figure 1:
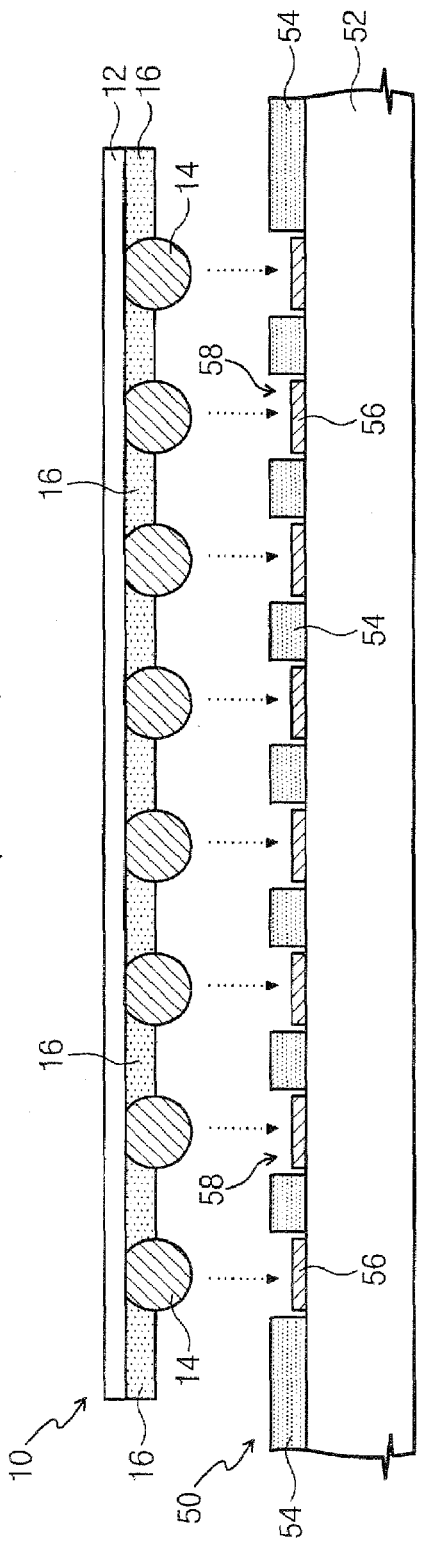
FIG. 1 is a cross-sectional view illustrating a conventional chip size package and a method of coupling the same.
Figure 2:
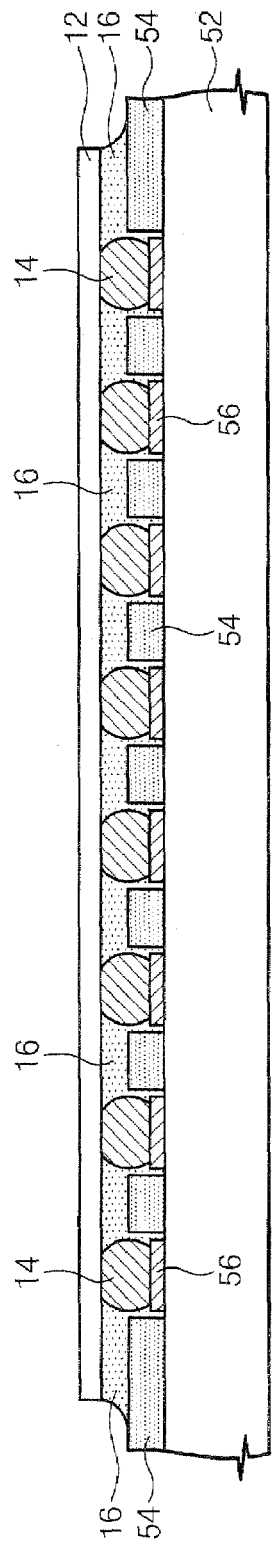
FIG. 2 is a cross-sectional view illustrating a conventional chip size package coupled to a circuit board.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a portion is referred to as being adjacent to another portion, it can directly contact the other portion, or intervening portions may also be present. Like reference numerals refer to like elements throughout.

FIG. 3A is a cross-sectional view illustrating a semiconductor package according to a first embodiment of the present invention.

Referring to FIG. 3A, a semiconductor package, e.g., a chip size package according to a first embodiment of the present invention includes a semiconductor chip 100 and a plurality of conductive balls, e.g., solder balls 102 formed on the semiconductor chip 100. The solder balls 102 may be formed using one or more metals such as lead and tin. For example, a metal layer may be formed on a joint surface of the semiconductor chip 100 and patterned to form a metal pattern, and then the metal pattern may be melted to form the solder balls 102, or solder paste may be printed on a pad of the semiconductor chip 100 and heated to form the solder balls 102. Alternatively, the solder balls 102 may be disposed on a joint surface of the semiconductor chip 100 and then heated to be joined to the semiconductor chip 100.

Figure 4:
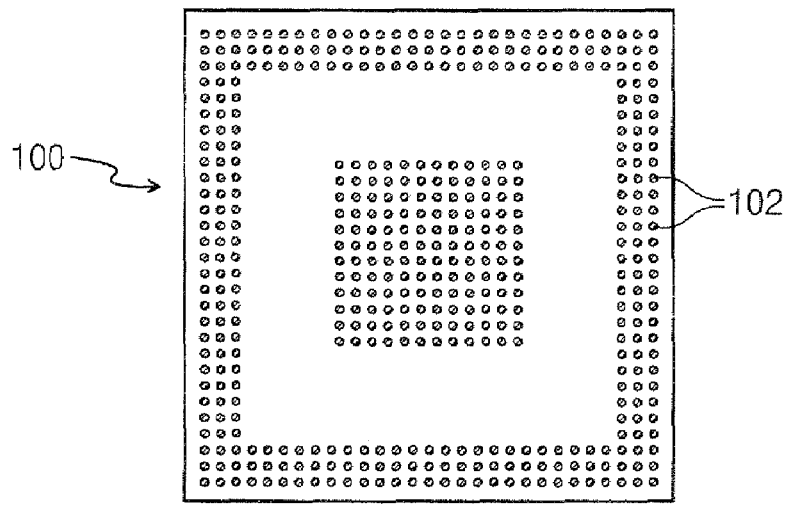
FIG. 4 is a plan view illustrating a coupling surface of a semiconductor package according to some embodiments of the present invention.

The solder balls 102 may be formed on the joint surface of the semiconductor chip 100 as illustrated in FIG. 4, but the arrangement of the solder balls 102 should not be limited thereto, and may be variously designed depending on the semiconductor chip being manufactured.

A dummy board 110 is bonded to the semiconductor chip 100. The dummy board 110 may be formed of an insulating material such as glass fiber and ceramic. The dummy board 110 may be preferably formed of a material with a small difference in the thermal expansion coefficient from the semiconductor chip 100 to relieve a stress applied to the solder balls 102 during thermal deformation.

Figure 5:
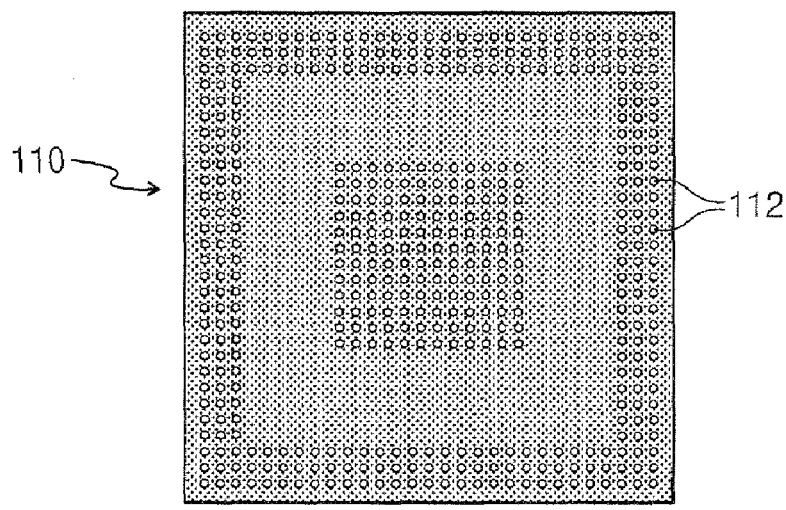
FIG. 5 is a plan view illustrating a dummy board according to an embodiment of the present invention.

As illustrated in FIG. 5, the dummy board 110 includes a plurality of openings 112 corresponding to the solder balls 102. The solder balls 102 are aligned with the openings 112 and protrude from the dummy board 110. The dummy board 110 supports side portions of the solder balls 102 to relieve a stress applied to the solder balls 102 when heat-treating the chip size package and coupling the chip size package to a circuit board.

An adhesive material 114 is interposed between the dummy board 110 and the semiconductor chip 100 to adhere the dummy board 110 to the semiconductor chip 100. The adhesive material 114 is pushed into gaps adjacent to curved portions of the solder balls 102 to support bottom portions of the solder balls 102 contacting the semiconductor chip 100 and fill gaps 120 between the dummy board 110 and the solder balls 102.

The adhesive material 114 may have fluidity and may be cured through a heat treatment process. The adhesive material 114 may be an inorganic material or an organic material that has fluidity. The adhesive material 114 may adhere the dummy board 110 to the semiconductor chip 100 through curing, and may have weak fluidity at a predetermined temperature to relieve a stress due to the thermal expansion coefficient difference between the semiconductor chip 100 and a circuit board.

The adhesive material 114 may be selected from conventional underfill materials. However, since the dummy board 110 supports the solder balls 102, a smaller amount of underfill material is required when compared with conventional packages. Therefore, the process time may be reduced when compared with the conventional underfill material.

The chip size package according to the present invention may be coupled to various types of circuit boards, not limited to the circuit board including a solder mask 154. The chip size package may be also coupled to a lead frame of a flip chip package as well as the circuit board.

FIG. 3B is a cross-sectional view illustrating a semiconductor package, e.g., chip size package according to a second embodiment of the present invention.

Referring to FIG. 3B, the chip size package according to the second embodiment has a structure similar to that of the chip size package according to the first embodiment. That is, a plurality of solder balls 102 are formed on a semiconductor chip 100 and a dummy board 110 is adhered to the semiconductor chip 100 using an adhesive material 114.

In the second embodiment, the dummy board 110 is wider than the semiconductor chip 100 in both width and length directions. Therefore, each edge of the dummy board 110 has an overhang portion OA with respect to the semiconductor chip 100.

Side and upper surfaces of the semiconductor chip 100 are covered with a molding material 130 such that the semiconductor chip 100 is encapsulated. The molding material 130 sequentially covers the upper and side surfaces of the semiconductor chip 100 and the overhang portion OA of the dummy board 110.

The molding material 130 protects the chip size package from an external impact and crack generation during heat treatment, and also isolates the semiconductor chip 100 from moisture and pollutants from the external environment. In addition, the molding material 130 may affix a heat radiating structure when the heat radiating structure is disposed on a rear surface of the semiconductor chip 100.

FIGS. 6 and 7 are cross-sectional views for illustrating a method of fabricating a semiconductor package, e.g., a chip size package according to an embodiment of the present invention.

Referring to FIG. 6, a semiconductor chip 100 is fabricated, and then a plurality of solder balls 102 is formed on the semiconductor chip 100. The solder balls 102 may be formed of a single metal or a metal alloy, and the solder balls 102 may be formed by various methods as is known in the art. The solder balls 102 are arranged on a joint surface of the semiconductor chip 100.

A dummy board 110 is formed independently of the fabrication of the semiconductor chip 100. The dummy board 110 includes openings 112 corresponding to positions of the solder balls 102 of the semiconductor chip 100. The openings 112 may be formed by mechanically or optically punching the dummy board 110.

The dummy board 110 may be formed of an insulating material such as resin, glass fiber, and ceramic, and may be preferably formed of a material with a small difference in the thermal expansion coefficient from the semiconductor chip 100 to relieve a stress applied to the solder balls 102 during thermal deformation.

An adhesive material 114 is applied to an adhesion surface of the dummy board 110. The adhesive material 114 may be an inorganic material or an organic material having fluidity. The adhesive material 114 may be reflowed and cured through the heat treatment to adhere the dummy board 110 to the semiconductor chip 100.

The adhesive material 114 is formed in a liquid, paste, gel, or slurry type having viscosity, and thus may be applied on the dummy board 110. The adhesive material 114 may be dried or cured to a predetermined degree after it is applied on the dummy board 110. Alternatively, the adhesive material 114 may be a thermoplastic sheet, and may be reflowed and cured by the heat treatment.

Referring to FIG. 7, the dummy board 110 is adhered to a joint surface of the semiconductor chip 100 after the adhesive material 114 is applied on the dummy board 110. Here, the solder balls 102 respectively correspond to the openings 112 of the dummy board 110, and the dummy board 110 is adhered to a surface of the semiconductor chip 100 where the solder balls 102 are not formed.

The dummy board 110 is adhered to the semiconductor chip 100 while supporting side portions of the solder balls 102. The adhesive material 114 is pushed by the dummy board 110 and is forced into gaps between the semiconductor chip 100 and curved portions of the solder balls 102.

When the adhesive material 114 has fluidity, it may be forced into the gaps between the semiconductor chip 100 and curved portions of the solder balls 102 and gaps between the solder balls 102 and the dummy board 110 by a pressing force. Alternatively, when the adhesive material 114 is formed of a sheet having no fluidity, it may be reflowed by the heat treatment and forced into the gaps between the semiconductor chip 100 and the curved portions of the solder balls 102 and the gaps between the solder balls 102 and the dummy board 110 (120, refer to FIG. 3A). In the present invention, the adhesive material 114 may be heat-treated during a relatively small heating time, when compared with the conventional underfill material.

Figure 8A:
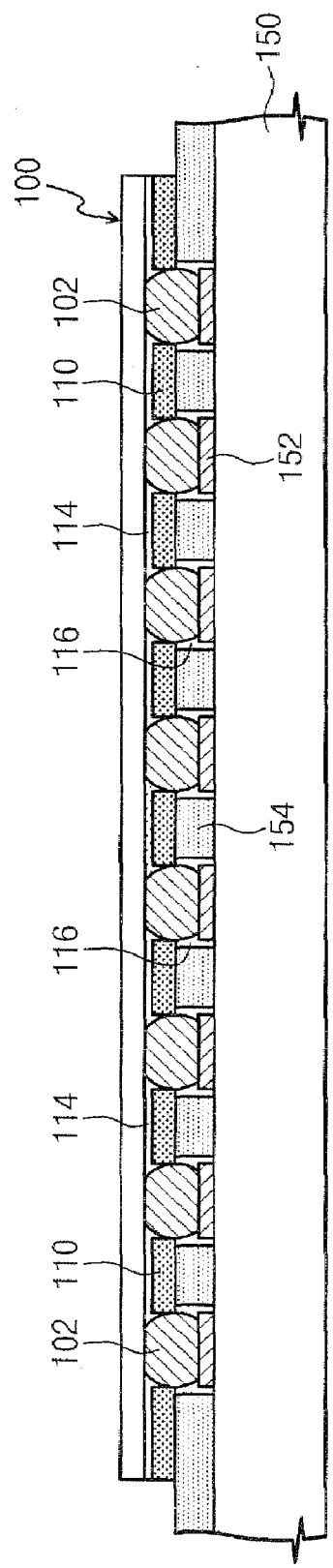
FIG. 8A is a cross-sectional view of a semiconductor package coupled to a circuit board according to a first embodiment of the present invention.
Figure 8B:
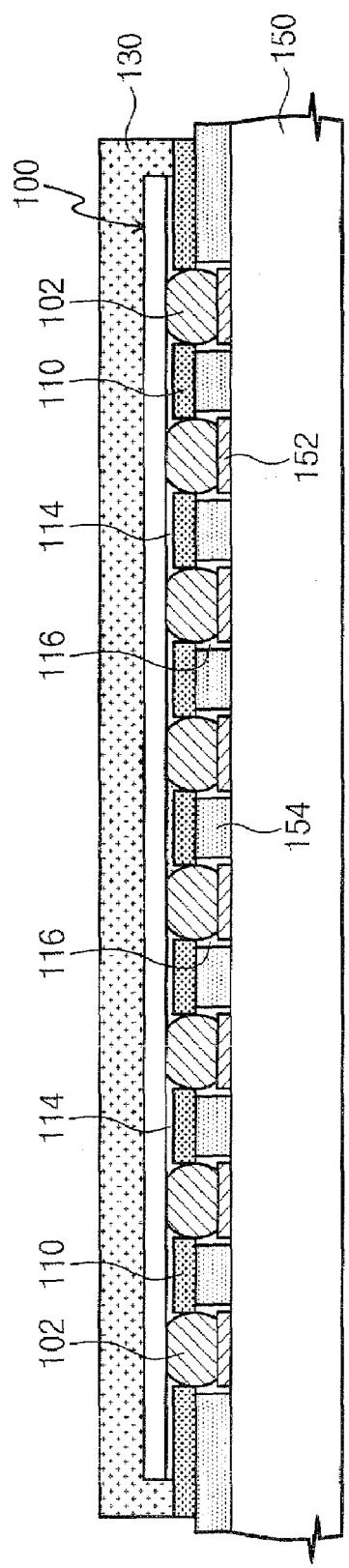
FIG. 8B is a cross-sectional view of a semiconductor package coupled to a circuit board according to a second embodiment of the present invention.

FIGS. 8A and 8B are cross-sectional views of a semiconductor package, e.g., a chip size package coupled to a circuit board according to first and second embodiments of the present invention, respectively.

Referring to FIG. 8A, the chip size package according to a first embodiment is coupled to the circuit board. The circuit board may be chosen from a printed circuit board (PCB), a flame-retardant glass fiber board, an organic circuit board, a mother board, a ceramic substrate, a hybrid circuit board, an integrated circuit package, a flexible circuit board, and a frame board of a flip chip package.

Generally, the solder mask 154 is formed on a coupling surface of the circuit board to provide a region for coupling of the circuit board and the solder balls 102. The solder mask 154 prevents the solder balls 102 from contacting other portions of the circuit board when the chip size package is heated. The solder mask 154 includes openings corresponding to the solder balls 102. Pads 152 are formed in the respective openings and the solder balls 102 are bonded to the pads 152.

The solder balls 102 melt at a reflow temperature and are thereby bonded to the pads 152. Here, the adhesive material 114 may be partially reflowed and then cured, or may be cured without reflowing.

Referring to FIG. 8B, in the chip size package according to the second embodiment, the molding material 130 may encapsulate the semiconductor chip 100, and prevent damage of the semiconductor chip 100 while coupling the chip size package to the circuit board or preparing the coupling thereof. Also, the molding material 130 may absorb an impact applied to the semiconductor chip 100 even after the coupling to prevent the crack generation and additionally relieve a stress applied to the solder balls 102.

Referring to FIGS. 8A and 8B, an underfill material 116 may be disposed around the portions of the solder balls 102 that are connected to the pads 152. The underfill material 116 may relieve a stress applied to bonding portions between the solder balls 102 and the pads 152 to prevent the solder balls 102 from coming off the pads 152.

Figure 9A:
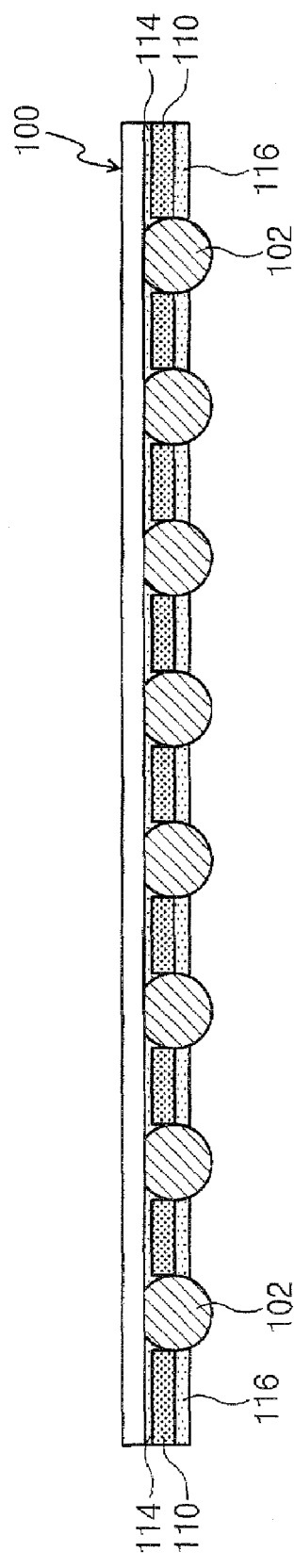
FIG. 9A is a cross-sectional view illustrating a modified example of a semiconductor package according to a first embodiment of the present invention.
Figure 9B:
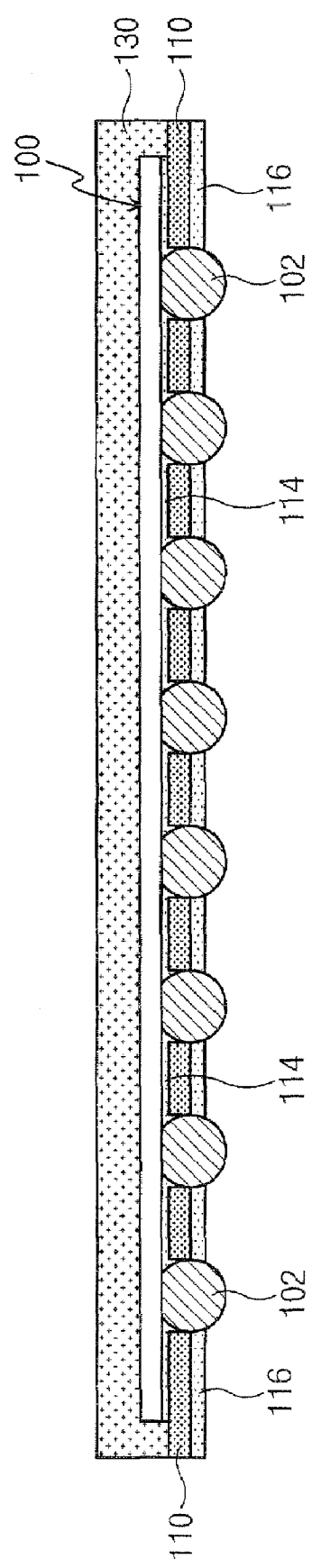
FIG. 9B is a cross-sectional view illustrating a modified example of a semiconductor package according to a second embodiment of the present invention.

FIGS. 9A and 9B are cross-sectional views illustrating modified examples of chip size packages according to first and second embodiments of the present invention, respectively.

Referring to FIGS. 9A and 9B, an underfill material 116 is applied on the dummy board 114 of the chip size packages according to the first and second embodiments. The underfill material 116 may be formed in a liquid, paste, gel, or slurry type having viscosity like the adhesive material 114, and may be applied or suspended using a screen. Also, the underfill material 116 may be partially cured after applying. The underfill material 116 may be used in a relatively small quantity when compared with the conventional underfill material.

Figure 10A:
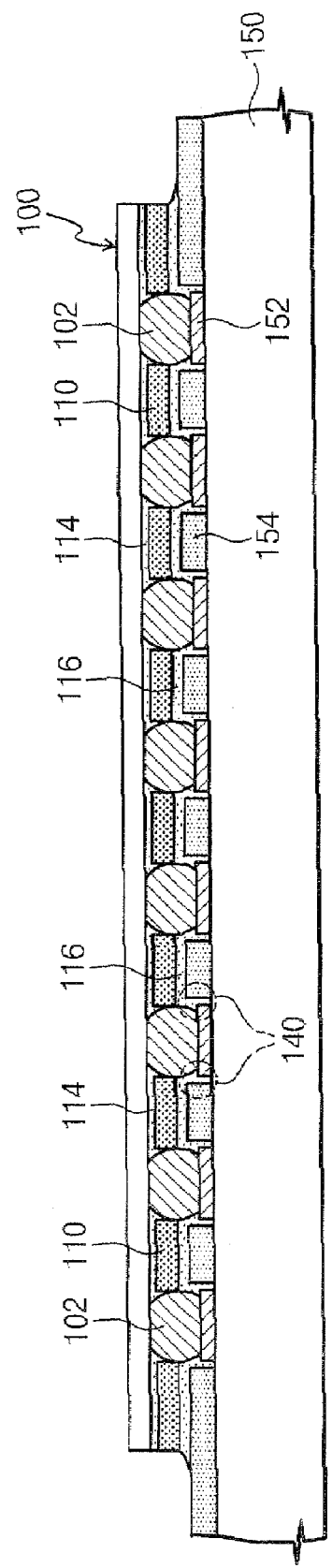
FIG. 10A is a cross-sectional view illustrating a modified example of a semiconductor package coupled to a circuit board according to a first embodiment of the present invention.
Figure 10B:
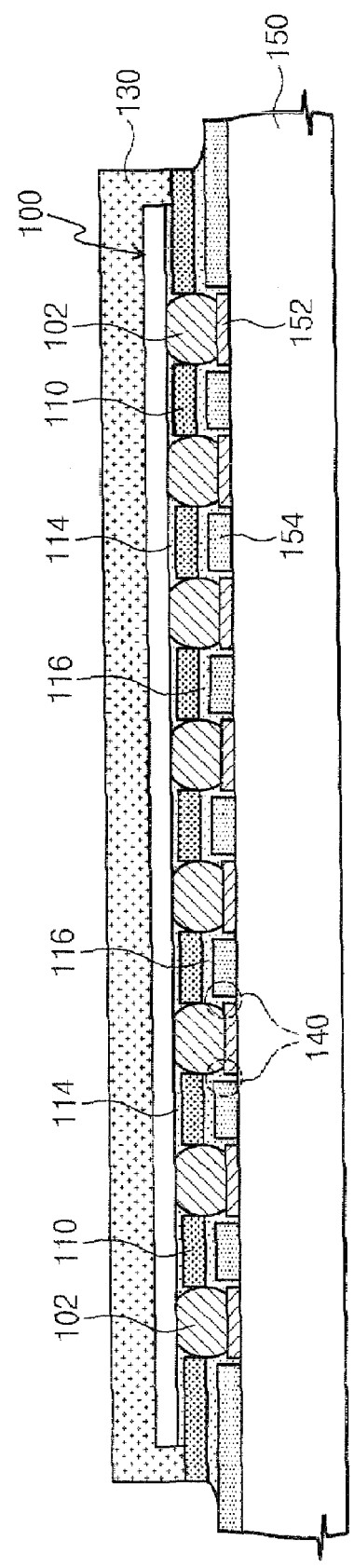
FIG. 10B is a cross-sectional view illustrating a modified example of a semiconductor package coupled to a circuit board according to a second embodiment of the present invention.

When the chip size package is coupled to the circuit board, as illustrated in FIGS. 10A and 10B, the underfill material 116 may be forced into gaps between the solder mask 154 and the solder balls 102 to fill the openings of the solder mask 154. The underfill material 116 filled in the openings of the solder mask 154 may relieve a stress applied to bonding portions between the solder balls 102 and the pads 152 to prevent the solder balls 102 from coming off the pads 152.

The chip size package according to the current embodiment may prevent the solder balls 102 from coming off the semiconductor chip 100 due to stress and also prevent the solder balls 102 from coming off the pads 152 of the circuit board. Therefore, a high reliability may be maintained during repetitive heating cycles.

The present invention should not be limited to the chip size package, and may be applied to various applications for relieving a stress applied to a solder ball or a solder bump formed on a semiconductor chip. Also, the present invention may be variously applied to fields for relieving a stress applied to a solder ball because of physical factors such as an external impact and thermal expansion coefficient difference.

As described above, the present invention can relieve a stress applied to conductive balls, e.g., solder balls by using a dummy board, and can support a coupling portion between the solder balls and a semiconductor chip using a smaller amount of material when compared with a conventional underfill material. Therefore, a material cheaper than the conventional underfill material can be selectively used, and a process time of reflowing and curing an adhesive material can be greatly reduced. In particular, in the case of mounting both surfaces where a plurality of chip size packages are coupled to a circuit board with time intervals in between each, the number of times of reflow and curing increases, and thus the total process time can be reduced even more by using the present invention.

Also, according to some embodiments of the present invention, since the semiconductor chip can be encapsulated by using the dummy board, the semiconductor chip can be protected from an external impact and crack generation during treatment of the chip size package.

Furthermore, a stress applied to a bonding portion between the solder balls and the circuit board can be relieved by additionally applying an underfill material on the dummy board.

Embodiments of the present invention provide semiconductor packages including a dummy board for relieving a stress. The semiconductor package includes a semiconductor chip, and a plurality of solder balls formed on a joint surface of the semiconductor chip. A dummy board includes openings aligned with the solder balls and is bonded to the joint surface of the semiconductor chip. An adhesive material is interposed between the semiconductor chip and the dummy board to adhere the dummy board to the semiconductor chip.

In some embodiments, the dummy board is larger than the semiconductor chip in width and length directions, and each edge of the dummy board adhered to the semiconductor chip has an overhang portion extending outwardly from the semiconductor chip in each direction. A molding material may cover side and upper surfaces of the semiconductor chip to encapsulate the semiconductor chip. The molding material covers the overhang portion and the side and upper surfaces of the semiconductor chip.

Embodiments of the present invention also provide methods of fabricating semiconductor packages including a dummy board. The method includes forming a semiconductor chip and forming a plurality of solder balls on a joint surface of the semiconductor chip. A dummy board is formed which includes a plurality of openings corresponding to the solder balls. An adhesive material is applied on an adhesion surface of the dummy board adhered to the joint surface of the semiconductor chip. The dummy board is adhered to the joint surface of the semiconductor chip such that the solder balls are aligned with the openings.

In other embodiments, the dummy board is larger than the semiconductor chip in width and length directions, and thus each edge of the dummy board adhered to the semiconductor chip has an overhang portion extending outwardly from the semiconductor chip in each direction. A molding material may encapsulate the semiconductor chip. The molding material may be applied so as to sequentially cover upper and side surfaces of the semiconductor chip and the overhang portion of the dummy board and may be cured.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package, comprising:
    a semiconductor chip;
    a plurality of conductive balls contacting a joint surface of the semiconductor chip;
    a dummy board including openings within which the conductive balls are aligned and bonded to the joint surface of the semiconductor chip, the dummy board supporting side portions of the conductive balls to relieve a stress applied to the conductive balls; and
    an adhesive material interposed between the semiconductor chip and the dummy board to adhere the dummy board to the semiconductor chip.

2. The semiconductor package of claim 1, wherein each edge of the dummy board includes an overhang portion with respect to the semiconductor chip, and a molding material encapsulates the rear and side surfaces of the semiconductor chip and the top of the overhang portion of the dummy board.

3. The semiconductor package of claim 1, wherein the adhesive material is disposed in gaps between the conductive balls so as to fill the gaps.

4. The semiconductor package of claim 3, wherein the adhesive material is also disposed in gaps between the conductive balls and the dummy board so as to fill the gaps.

5. The semiconductor package of claim 1, further comprising an underfill material disposed on the dummy board.

6. The semiconductor package of claim 5, wherein the conductive balls are bonded to pads of a circuit board, wherein the circuit board comprises:
    a solder mask including a plurality of openings corresponding to the conductive balls; and
    a plurality of pads disposed in the openings of the solder mask.

7. The semiconductor package of claim 6, wherein the underfill material is disposed in the openings of the solder mask so as to fill gaps between the conductive balls and the solder mask.

8. The semiconductor package of claim 1, wherein the adhesive material comprises one of a liquid, paste, gel, and slurry.

9. A semiconductor package, comprising:
    a semiconductor chip;
    a plurality of conductive balls disposed on a joint surface of the semiconductor chip;
    a dummy board including openings aligned with the conductive balls and bonded to the joint surface of the semiconductor chip, the dummy board supporting side portions of the conductive balls to relieve a stress applied to the conductive balls; and
    an adhesive material interposed between the semiconductor chip and the dummy board to adhere the dummy board to the semiconductor chip, wherein the adhesive material comprises a thermoplastic sheet.

10. A method of fabricating a semiconductor package, the method comprising:

forming a semiconductor chip having a joint surface;

forming a plurality of conductive balls on the joint surface of the semiconductor chip;

forming a dummy board including a plurality of openings corresponding to the conductive balls;

applying an adhesive material on an adhesion surface of the dummy board; and adhering the dummy board to the joint surface of the semiconductor chip such that the conductive balls are aligned with the openings, the dummy board supporting side portions of the conductive balls to relieve a stress applied to the conductive balls.

11. The method of claim 10, further comprising encapsulating side and rear surfaces of the semiconductor chip with a molding material.

12. The method of claim 11, wherein the dummy board is formed such that each edge is larger than the semiconductor chip by a predetermined width, the dummy board is adhered to the joint surface of the semiconductor chip, and the molding material covers the side and rear surfaces of the semiconductor chip and an overhang portion of the dummy board.

13. The method of claim 12, further comprising heat-treating the semiconductor chip with the dummy board adhered to cure the adhesive material.

14. The method of claim 13, wherein the heat-treating includes heat-treatment for bonding the conductive balls to pads of a circuit board.

15. The method of claim 10, wherein the adhesive material is squeezed between the dummy board and the semiconductor chip to fill gaps between the conductive balls during the adhering of the dummy board.

16. The method of claim 10, further comprising applying an underfill material on the dummy board before adhering the dummy board to the semiconductor chip.

17. The method of claim 16, further comprising curing the underfill material.

18. The method of claim 17, wherein the adhesive material and the underfill material are heat-treated and cured while the conductive balls are bonded to pads of a circuit board.

19. The method of claim 16, wherein the conductive balls are bonded to pads of a circuit board, the circuit board comprises:

a plurality of pads including the conductive balls bonded thereon; and a solid mask having openings, the openings formed in a region having the pads corresponding to the conductive balls, and the underfill material fills gaps between the solder mask and the conductive balls while the conductive balls are bonded to the pads of the circuit board.

20. The method of claim 19, wherein the underfill material is forced into the gaps between the conductive balls and the solder mask.

21. The method of claim 10, wherein forming the dummy board comprises one or more of mechanically and optically punching the dummy board to form the openings.

* * * * *

UNITED STATES PATENT AND TRADEMARK OFFICE
CERTIFICATE OF CORRECTION

PATENT NO. : 7,612,450 B2  Page 1 of 1
APPLICATION NO. : 11/765367
DATED : November 3, 2009
INVENTOR(S) : Jong-Gi Lee et al.

It is certified that error appears in the above-identified patent and that said Letters Patent is hereby corrected as shown below:

Column 5, line 20, the word "chin" should read -- chip --.

Signed and Sealed this

Twenty-third Day of February, 2010

David J. Kappos
*Director of the United States Patent and Trademark Office*